(12) United States Patent
Kazi et al.

(10) Patent No.: US 8,140,316 B2
(45) Date of Patent: Mar. 20, 2012

(54) SYSTEMS AND METHODS FOR IMPROVING DIGITAL SYSTEM SIMULATION SPEED BY CLOCK PHASE GATING

(75) Inventors: Tauseef Kazi, San Diego, CA (US); Haobo Yu, Irvine, CA (US); Lukai Cai, San Diego, CA (US); Mahesh Sridharan, San Diego, CA (US); Viraphol Chaiyakul, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 643 days.

(21) Appl. No.: 12/265,661

(22) Filed: Nov. 5, 2008

(65) Prior Publication Data

US 2010/0114551 A1 May 6, 2010

(51) Int. Cl.
*G06F 17/50* (2006.01)
*G06F 3/00* (2006.01)
(52) U.S. Cl. ............. 703/16; 703/19; 716/106; 716/107
(58) Field of Classification Search .................... 703/16, 703/19, 2; 716/102, 106, 107, 113; 714/726
See application file for complete search history.

(56) References Cited

U.S. PATENT DOCUMENTS

| | | | |
|---|---|---|---|
| 5,355,321 A | 10/1994 | Grodstein et al. | |
| 5,684,808 A * | 11/1997 | Valind | 714/726 |
| 5,771,375 A | 6/1998 | Mains | |
| 5,862,149 A * | 1/1999 | Carpenter et al. | 714/726 |
| 6,163,876 A * | 12/2000 | Ashar et al. | 716/107 |
| 6,470,482 B1 * | 10/2002 | Rostoker et al. | 716/102 |
| 6,651,225 B1 * | 11/2003 | Lin et al. | 716/113 |
| 6,785,873 B1 * | 8/2004 | Tseng | 716/102 |
| 6,810,507 B2 * | 10/2004 | Biswal | 716/106 |
| 7,055,118 B1 * | 5/2006 | Kamepalli et al. | 716/107 |
| 7,257,524 B2 | 8/2007 | Schilp et al. | |
| 2003/0171908 A1 * | 9/2003 | Schilp et al. | 703/16 |
| 2004/0002846 A1 * | 1/2004 | Lutz et al. | 703/19 |
| 2004/0015739 A1 * | 1/2004 | Heinkel et al. | 714/37 |

OTHER PUBLICATIONS

International Search Report & Written Opinion—PCT/US2009/063454, International Search Authority—European Patent Office—Mar. 19, 2010.
Naroska E et al: "Efficient parallel timing simulation of synchronous models on networks of workstations" Journal of Systems Architecture, Elsevier BV, NL, vol. 47, No. 6, Jun. 1, 2001, pp. 517-528, XP004300483 ISSN: 1383-7621 the whole document.

* cited by examiner

*Primary Examiner* — Thai Phan
(74) *Attorney, Agent, or Firm* — William M. Hooks

(57) ABSTRACT

An apparatus for simulating digital systems is described. The apparatus includes a processor and memory in electronic communication with the processor. Instructions that are executable by the processor are stored in the memory. A simulation tool is started. The simulation tool is capable of simulating a plurality of components. A clock phase is adjusted to be turned off for at least one of the components. A digital system is simulated that includes the at least one component. The simulation does not simulate the clock phase for the at least one component.

30 Claims, 12 Drawing Sheets

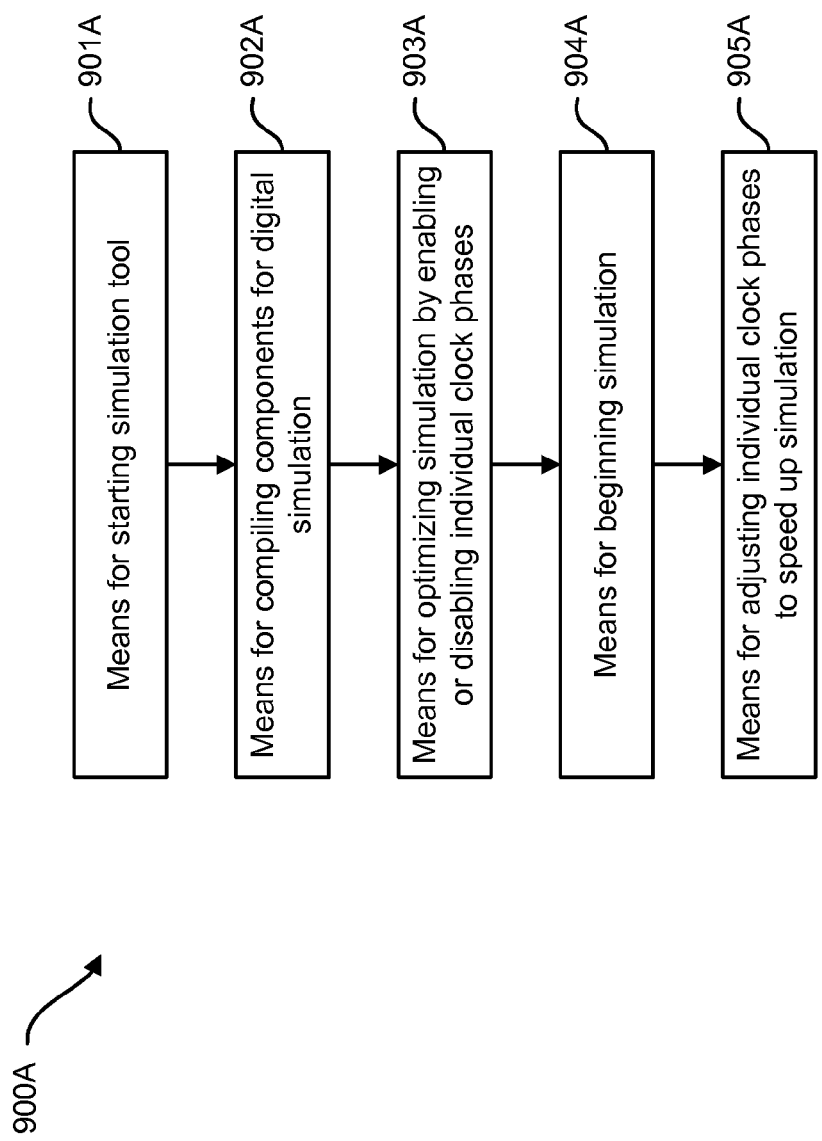

SYSTEMS AND METHODS FOR IMPROVING DIGITAL SYSTEM SIMULATION SPEED BY CLOCK PHASE GATING

TECHNICAL FIELD

The present disclosure relates generally to digital system simulations. More specifically, the present disclosure relates to a technique for improving digital simulation speed by clock phase gating.

BACKGROUND

Electronic devices (computers, cellular telephones, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for simulation software that can simulate digital circuits and/or digital systems. Simulation software may be used to verify or test a hardware design before the hardware is actually made. Simulators may be used to check different levels of a hardware design. For example, simulators may be used to verify transistors, gates, circuits, chips, processors, algorithms, etc., prior to building them in the complex semiconductor process.

Digital circuits are often dependent on a clock or clocks for timing of the circuits or systems. Benefits may be realized by providing improved simulation software with improved clocking capabilities.

BRIEF DESCRIPTION OF THE DRAWINGS

FIG. 9A illustrates means-plus-function blocks corresponding to the method of FIG. 9;

DETAILED DESCRIPTION

An apparatus for simulating digital systems is disclosed. The apparatus includes a processor and memory in electronic communication with the processor. Executable instructions are stored in the memory. A simulation tool is started. The simulation tool is capable of simulating a plurality of components. A clock phase is adjusted to be turned off for at least one of the components. A digital system is simulated that includes the at least one component. The simulation does not simulate the clock phase for the at least one component.

Other clock phases may be dynamically adjusted during simulation of the digital system. The plurality of components may include clock phase settings to enable and disable clock phases. The clock phase settings may include a pre-rise phase setting, a rise phase setting, a post-rise phase setting, a pre-fall phase setting, a fall phase setting and a post-fall phase setting.

Each component of the plurality of components may be configured for adjusting the component's clock phases. In addition, each component may be configured for dynamically adjusting the component's clock phases during simulation of the digital system. The plurality of components may include logic gates, integrated circuits, etc. The clock phase may be selected from the group consisting of a pre-rise phase, a rise phase, a post-rise phase, a pre-fall phase, a fall phase and a post-fall phase.

A method for simulating digital systems is disclosed. A simulation tool is started. The simulation tool is capable of simulating a plurality of components. A clock phase is adjusted to be turned off for at least one of the components. A digital system is simulated that includes the at least one component. The simulation does not simulate the clock phase for the at least one component.

An apparatus for simulating digital systems is disclosed. The apparatus includes means for starting a simulation tool. The simulation tool is capable of simulating a plurality of components. The apparatus includes means for adjusting a clock phase to be turned off for at least one of the components. The apparatus also includes means for simulating a digital system that includes the at least one component. The means for simulating does not simulate the clock phase for the at least one component.

A computer-program product for simulating digital systems is disclosed. The computer-program product comprises a computer-readable medium having instructions thereon. The instructions include code for starting a simulation tool. The simulation tool is capable of simulating a plurality of components. The instructions include code for adjusting a clock phase to be turned off for at least one of the components. The instructions also include code for simulating a digital system that includes the at least one component. The code for simulating does not simulate the clock phase for the at least one component.

Figure 1:
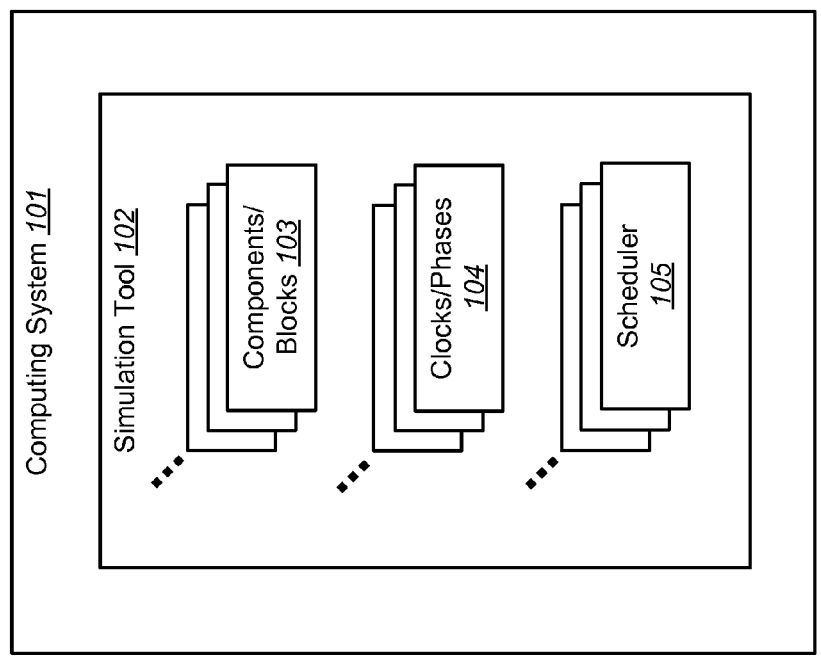
FIG. 1 is a block diagram illustrating an example of a simulation tool implemented within a computing system.

FIG. 1 is a block diagram illustrating an example 100 of a simulation tool 102 implemented within a computing system 101. The simulation tool 102 is software that simulates the behavior of a digital system or digital components 103. Typically a simulation tool 102 is used to verify hardware before fabrication to verify functionality. A simulator 102 has to model the behavior of the system correctly.

The computing system 101 is not limited to a computer system using a specific type of hardware or operating system. For example, the computer system 101 may be a one-board type of computer, such as a controller or a blade server, a typical desktop computer, a Windows-based system, a Unix-based system, a Sun Solaris system, a Linux-based system, a distributed system with multiple computing devices, etc. The simulation tool 102 may run on one or more computing systems 101. The simulation tool 102 may include one or more executable programs, libraries and/or sets of data.

The simulation tool 102 may be used to simulate digital systems and/or digital components. For example, the simulation tool 102 may be used to simulate the digital circuitry in a cellular phone. The simulation tool 102 may represent one or more digital components/blocks 103. Digital components 103 may include certain chips, integrated circuits, transistors, digital building blocks such as logic gates, etc. The simulation tool 102 may represent one or more clock cycles 104. A represented clock cycle 104 may be referred to as a phase 104. The simulation tool 102 may include one or more schedulers 105. A scheduler 105 may be used to simulate clock phases 104 that are passed to the digital components or blocks 103.

An actual system may only have two phases: when the clock changes from high to low and again when it changes from low to high. Typically, simulators 102 have far more phases 104 than just the two transitions of a signal or clock. These phases 104 are called delta cycles. Delta cycles are required to correctly simulate the massively parallel behavior of a digital system on a single processor computer that can only process sequentially. The numerous delta cycle transitions are generated mostly due to transitions on the clock edges.

System level simulators (simulators that simulate models at higher abstraction than RTL (Register Transfer Level)) do not usually model these delta cycles. Instead, they introduce extra phases 104 for each clock edge to correctly model the causality of the design and to guarantee that the output sequence will be in the correct order. This will help guarantee the timing accuracy. So instead of two phases 104, there may be four or six phases 104 in a system level simulator. A system level simulator may also have more than six phases 104.

In one configuration, the simulation tool 102 may support more than six phases 104. For example, the simulation tool 102 may model a rise phase, a fall phase, a pre-rise phase, a pre-fall phase, and any number of post-rise and post-fall phases. These different phases are illustrated below. Alternatively, the simulation tool 102 may introduce additional pre-rise phases or pre-fall phases. Pre-rise and pre-fall phases may be used to sample the inputs of simulated digital systems. Rise and fall phases may be used to process the inputs and drive the outputs of simulated digital systems. Post-rise and post-fall phases may be used to delay the output.

During simulation, the phases 104 consume CPU resources. More phases 104 may result in a slowing down of the simulator 102. The speed of the simulation may be significantly increased if some of the clock phases 104 that are simulated can be dynamically turned off when they are not needed. For example, a simulated digital system may not require any post-fall phases. The speed of the simulation tool 102 may be significantly increased if the post-fall phases for the simulated digital system are turned off. As another example, one component of a simulated digital system may not need any post-rise phases. The speed of the simulation tool 102 may be significantly increased if the post-fall phase for one component of the simulated digital system is turned off.

Figure 2:
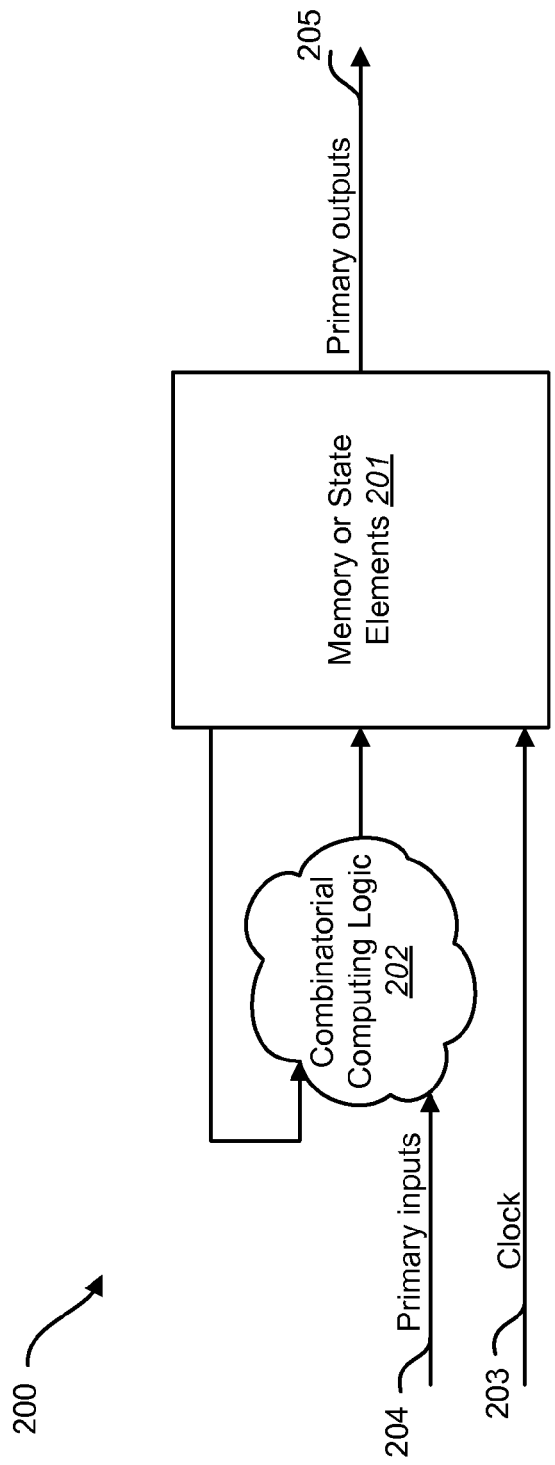
FIG. 2 illustrates an example of components used in a digital system that may be modeled with a simulation tool.

FIG. 2 illustrates an example of some of the components that may be used in a digital system 200 that may be modeled with a simulation tool 102. Synchronous digital systems 200 may include memory or state elements 201 and combinatorial logic 202. Clocks 203 are essential components of digital systems 200.

The digital system 200 may process a series of inputs 204 and generate a series of outputs 205, one set at a time on one or more edges of the clock 203. Processing usually occurs on both edges, but outputs 205 may be generated on only the positive edge, only the negative edge or on both edges.

Figure 3:
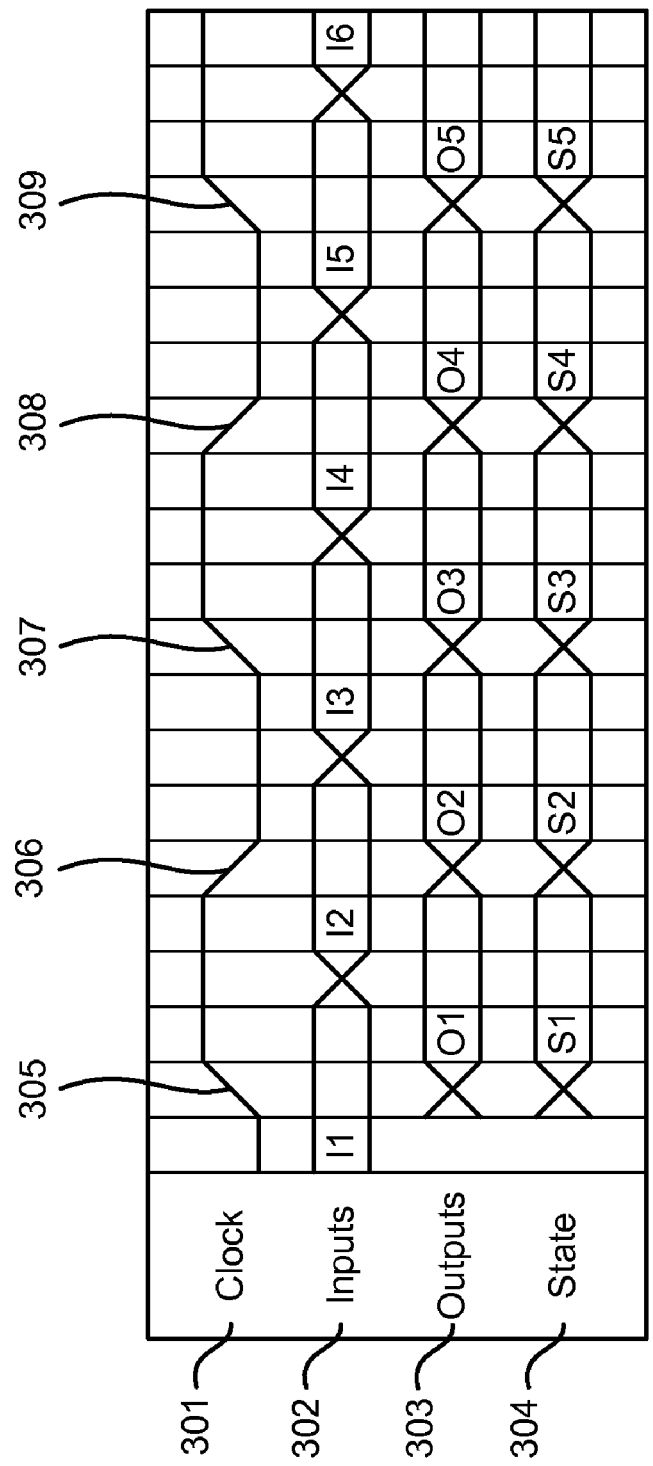
FIG. 3 illustrates an example of the behavior of a system that is sensitive on both edges of a clock signal.

FIG. 3 illustrates an example of the behavior of a system that is sensitive on both edges of the clock signal 301. The system changes state 304 and generates a new output 303 at every clock 301 edge. Inputs 302 are represented as I1-I6. Outputs 303 are represented as O1-O5. Various states 304 of the system are represented as S1-S5. As shown, a clock transition 305, where the input is I1, causes the output to change to O1 and the state to change to S1. Another clock transition 306, where the input is I2, causes the output to change to O2 and the state to change to S2. Other clock transitions 307-309 similarly cause changes to the outputs 303 and the state 304. The large number of output 303 changes may decrease the simulation speed. Clock gating techniques may be used in digital systems to turn off unnecessary clocks 301 to increase simulation speed. Clock gating may imply that all phases of the clock 301 are completely turned off when not needed, and all phases of the clock 301 are kept on during normal operation.

There are several techniques that may be employed when modeling digital systems 200 using a simulation tool 102. In the case of simulation tools 102 that model timing accuracy, the clocks 301 may be completely kept on during processing and may be turned off when the block 103 is idle to improve simulation speed.

Higher speed system level simulation tools usually model the timing approximately rather than accurately. In this case, the falling edges may not be modeled at all. The rising edges may behave the same way as timing accurate simulators.

Very high speed system simulation tools that are targeted for software simulation usually do not model the clock 301 at all. Therefore, these simulation tools do not require the clock 301 to be gated. These simulation tools typically cannot model any sense of timing accuracy and may not even function correctly for systems that depend on timing.

Figure 4:
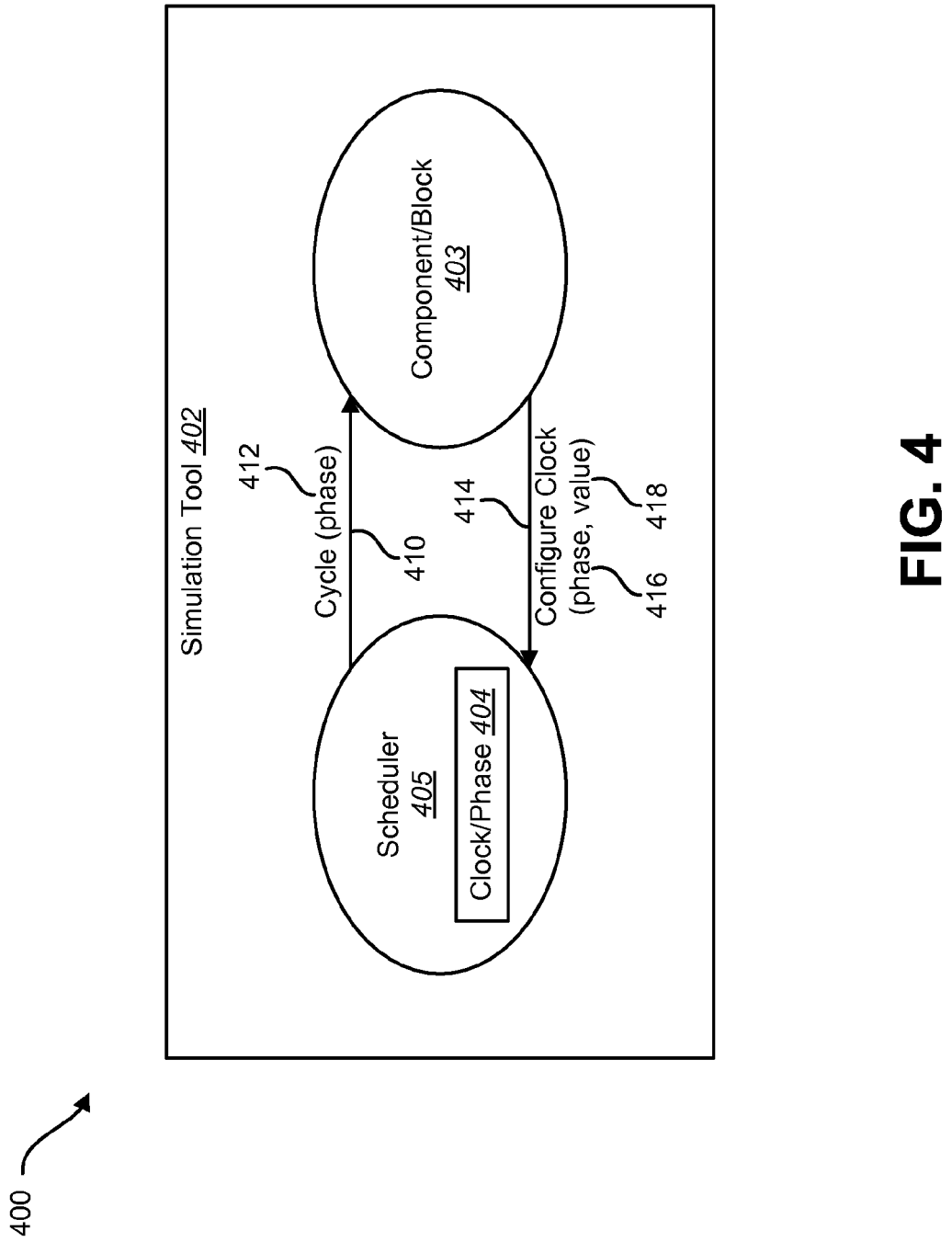
FIG. 4 is a block diagram illustrating an example of the interaction between a scheduler and a component or block.

FIG. 4 is a block diagram 400 illustrating an example of the interaction between a scheduler 405 and a component or block 403. This illustration shows an example of a digital simulation tool 402 with a complex clocking scheme capable of dynamically enabling or disabling individual phases of the clock 404. The clocking scheme may have multiple phases and support all abstraction levels. The ability to turn off individual phases in the simulation tool 402 may help speed up simulation.

The scheduler 405 includes the clocks/phases 404 for the component/block 403. The scheduler 405 triggers the block 403 on each of its clock phases 404 through a cycle 410 call to the block 403. The cycle 410 call may be a function call that notifies the block 403 of the clock 404 and the particular phase of the clock 404 through use of a phase parameter 412. The phase parameter 412 may indicate which phase of the clock is occurring in the simulation (e.g., pre-rise, rise, pre-fall, etc.) When the block 403 receives the cycle 410 call, it 403 will know the simulated clock and the phase 412, and can exhibit its behavior accordingly.

The block 403 may configure the clock 404, including phases, through a configure clock 414 call. The configure call 414 may include a phase parameter 416 to indicate which phase the call is directed towards, and a value parameter 418 to indicate whether the phase is to be turned on or off. In this way the block 403 is able to configure its own clock phases 404 on or off.

In one implementation, the scheduler 405 may be inherited from a class called CVI_ClockSource, while the component or block 403 may be inherited from a class called CVI_ClockSink. The scheduler 405 may be able to trigger the block 403 on each of its clock phases using a CycleCall member function, while the block 403 can configure its phases on or off using a ConfigClock member function. One possible simplified C++ header file for CVI_ClockSource and CVI_ClockSink is shown in Listing 1, below.

---
Listing 1.
---
```
// Clock phase information
enum ClockPhaseType
{
    PRE_RISE  = 0x01,
    RISE      = 0x02,
    POST_RISE = 0x04,
    PRE_FALL  = 0x08,
    FALL      = 0x10,
    POST_FALL = 0x20
};
class CVI_ClockSource
{
    explicit CVI_ClockSource(const QC_UInt32 p_numPorts);
    virtual bool ConfigClock(const QC_UInt32 p_sourcePortId,
                    const QC_UInt32 p_neededPhase) = 0;
};
class CVI_ClockSink
{
    explicit CVI_ClockSink(const QC_UInt32 p_numPorts);
    virtual void CycleCall(const QC_UInt32 p_sinkPortId,
                    const ClockPhaseType p_phase) = 0;
};
```

Figure 5:
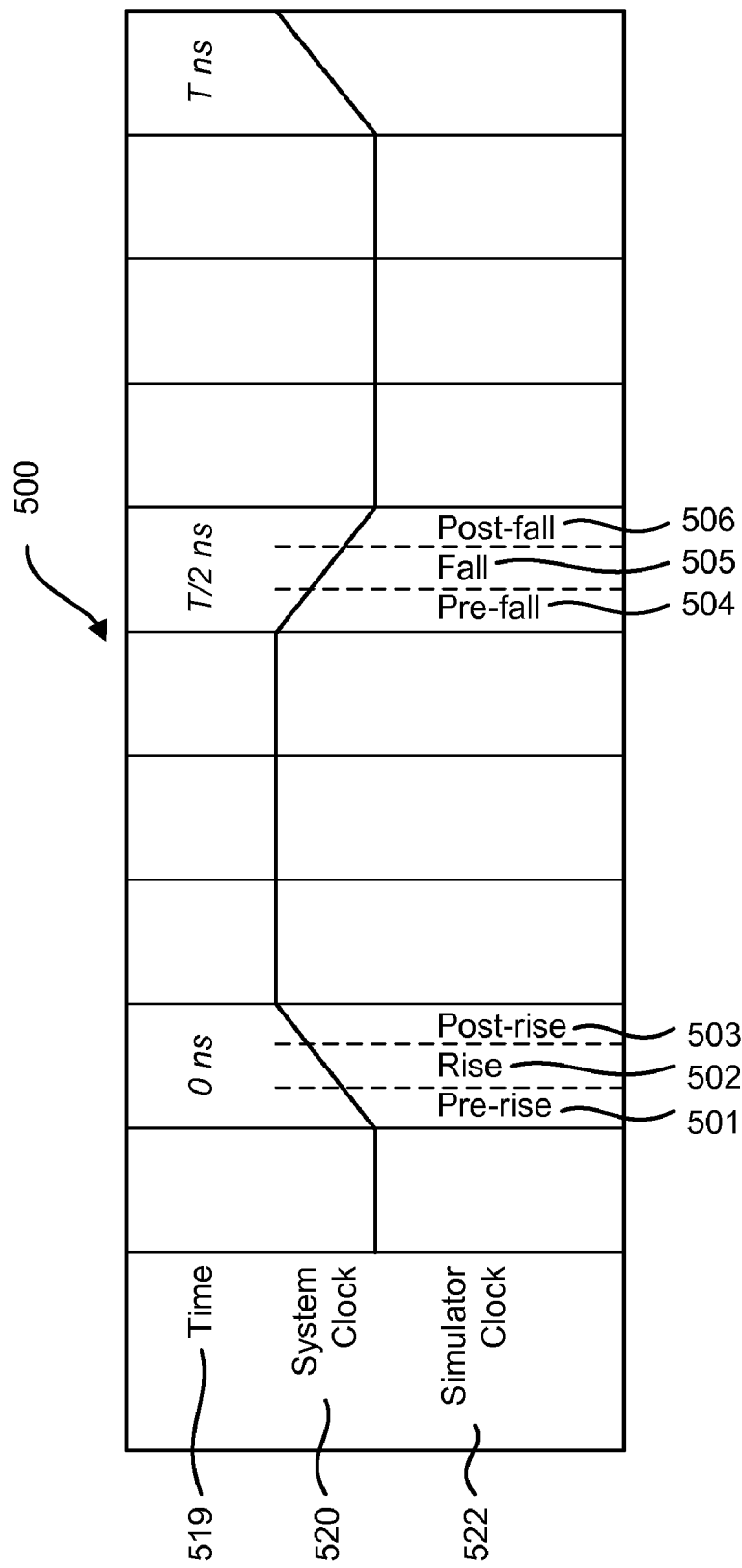
FIG. 5 illustrates an example showing the clock phases implemented in the present systems and methods.

FIG. 5 illustrates an example of clock phases that may be used by the simulation tool 102. The waveform 500 depicts the clock phases used. Time 519 is shown at the top of the waveform 500. The waveform 500 is for a system clock 520. A simulator clock 522 phase state is also shown. Each block 103 may have individually configured phases 104, as needed, for example to enable a faster simulation. The phase configuration may be based on the timing accuracy needed, the internal activity of the block 103, the block's state or the like.

In one configuration, the clock phases 104 used by the simulation tool 102 may include a rise phase 502 and/or a fall 505 phase. The rise 502 and fall 505 transitions illustrated in FIG. 5 happen at time 0 and time T/2 respectively. They may be used for processing the input and generating the outputs to the digital system 200. The clock phases 104 used by the simulation tool 102 may also include a pre-rise 501 and/or a pre-fall phase 504. The pre-rise 501 and pre-fall phases 504 are simulation constructs. The pre-rise 501 and pre-fall 504 phases happen at time 0 and time T/2 respectively but before their corresponding rise 502 and fall 505 phases. They may be used for sampling the inputs.

In yet another configuration, the clock phases 104 used by the simulation tool 102 may include a post-rise 503 and/or a post-fall 506 phase. The post-rise 503 and/or post-fall 506 phase are also simulation constructs. The post-rise 503 and post-fall 506 phases occur after their corresponding rise 502 and fall 505 phases. They may be used to delay the outputs and as intermediate signals for timing accuracy.

Figure 6:
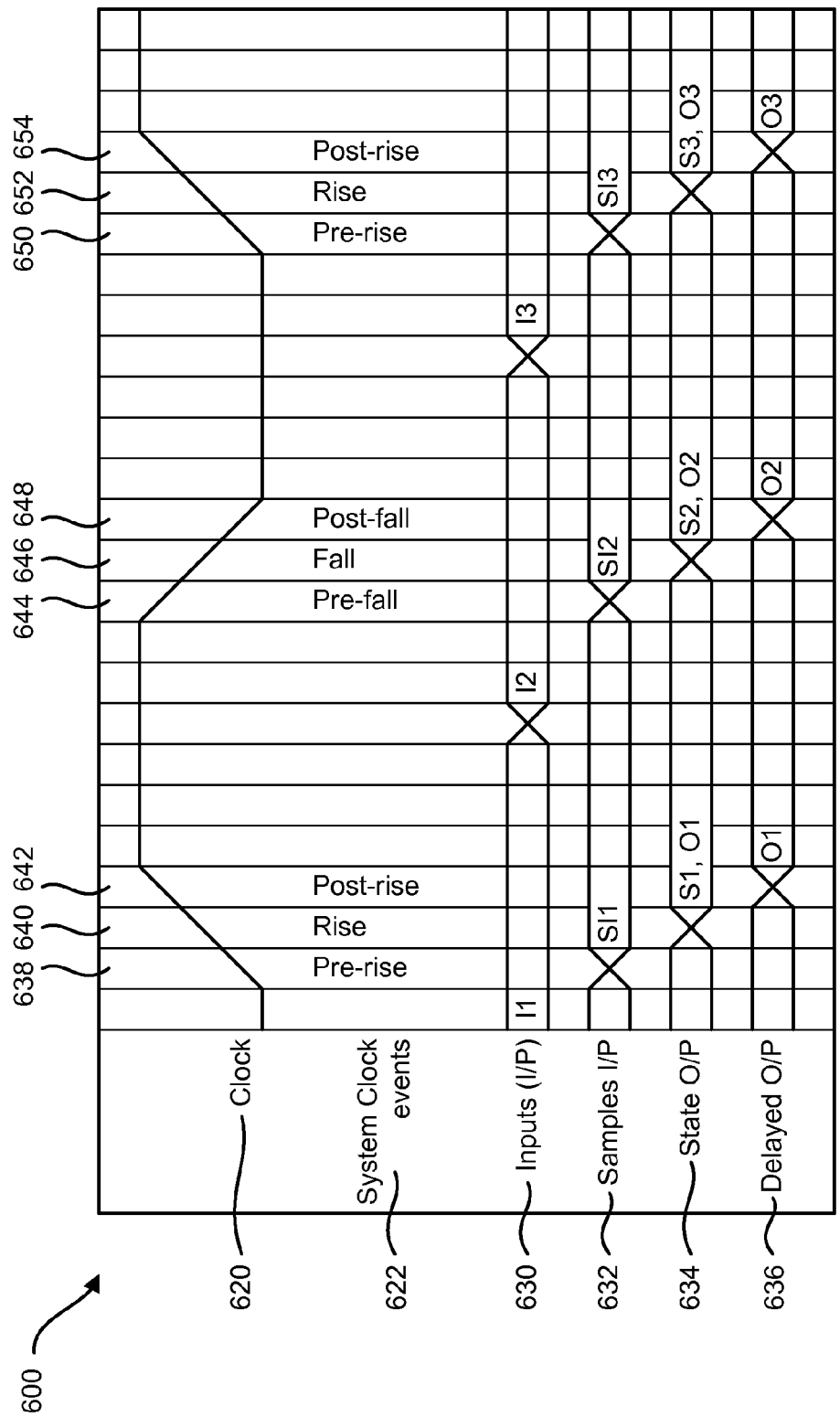
FIG. 6 illustrates a waveform of a timing accurate simulation.

FIG. 6 illustrates a waveform 600 of a timing accurate simulation. In a timing accurate simulation there may be many events per edge. Each of these events may slow down the simulation. The present systems and methods provide the ability to turn on/off specific phases as needed.

A clock 620 is shown. System clock events 622 corresponding to the clock 620 are also illustrated. Inputs (I/P) 630 are shown and denoted as I1, I2 and I3. Input samples 632 are shown and denoted as S11, S12 and S13. States 634, which are also outputs (O/P), are shown and denoted as S1, O1, S2, O2, S3 and O3. The delayed outputs 636 are also shown. The delayed outputs 636 are the outputs O1-O3 but delayed in time.

The waveform 600 in FIG. 6 shows several events on each clock 620 edge. The phases are also shown. The samples input 632 changes on the first pre-rise phase 638. The state output 634 changes on the first rise phase 640. The delayed outputs 636 transition on the first post-rise phase 642. Similar transitions are shown with respect to the first pre-fall phase 644, fall phase 646 and post-fall phase 648, and with the second pre-rise 650, rise 652 and post-rise 654 phases.

Figure 7:
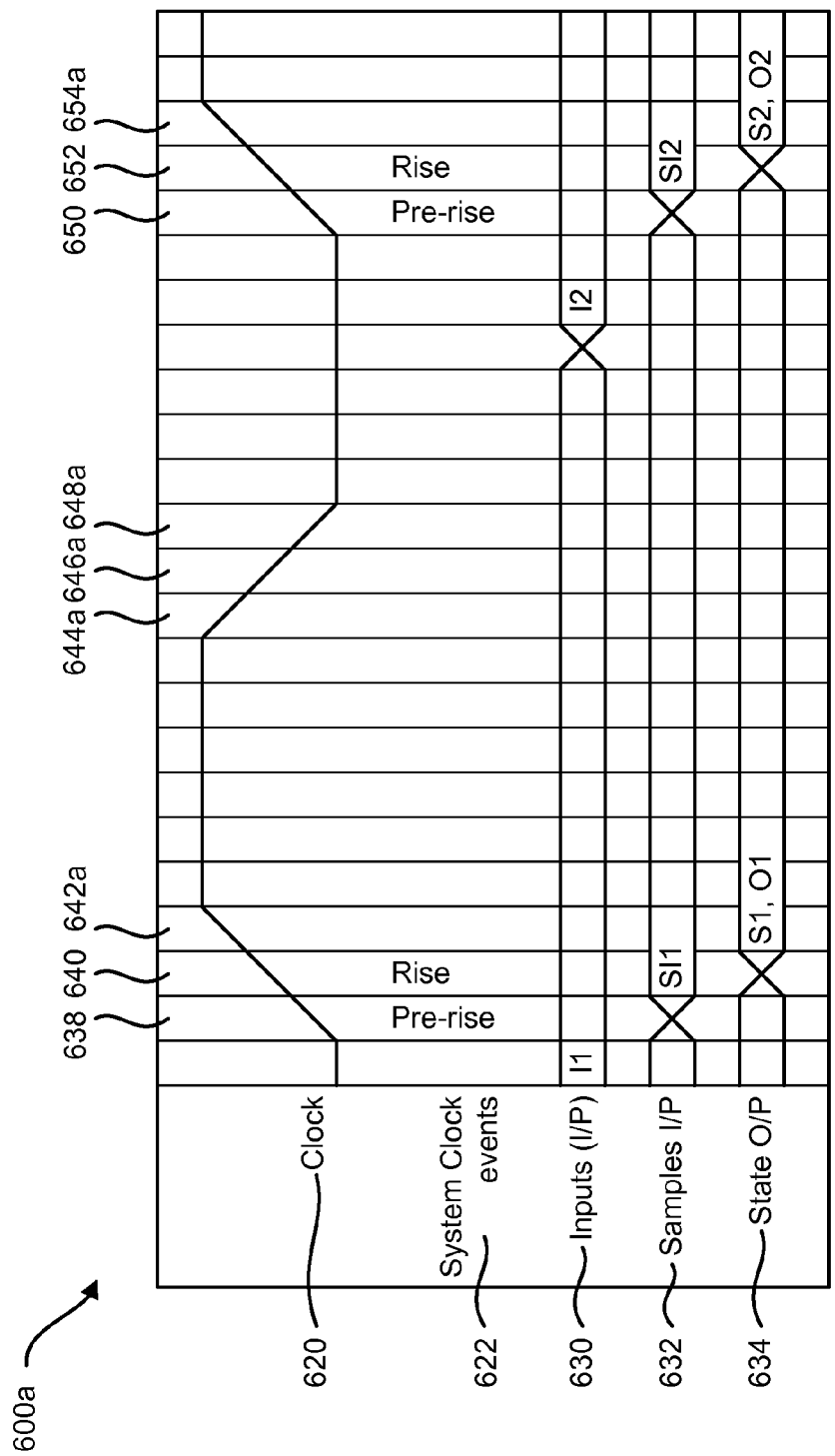
FIG. 7 illustrates the waveform of FIG. 6 with specific phases turned off.

FIG. 7 illustrates the waveform 600a of FIG. 6 with specific phases having been turned off. The present systems and methods enable particular clock phases to be turned off for one or more components 103. In the example shown, the post-rise 642a, pre-fall 644a, fall 646a, post-fall 648a and post-rise 654a phases have all been turned off. Thus, the system clock events 622 do not show these phases that have been turned off. These phases may be turned off, for example, if these phases are not needed to properly simulate the digital system, which may speed up the simulation significantly.

Figure 8:
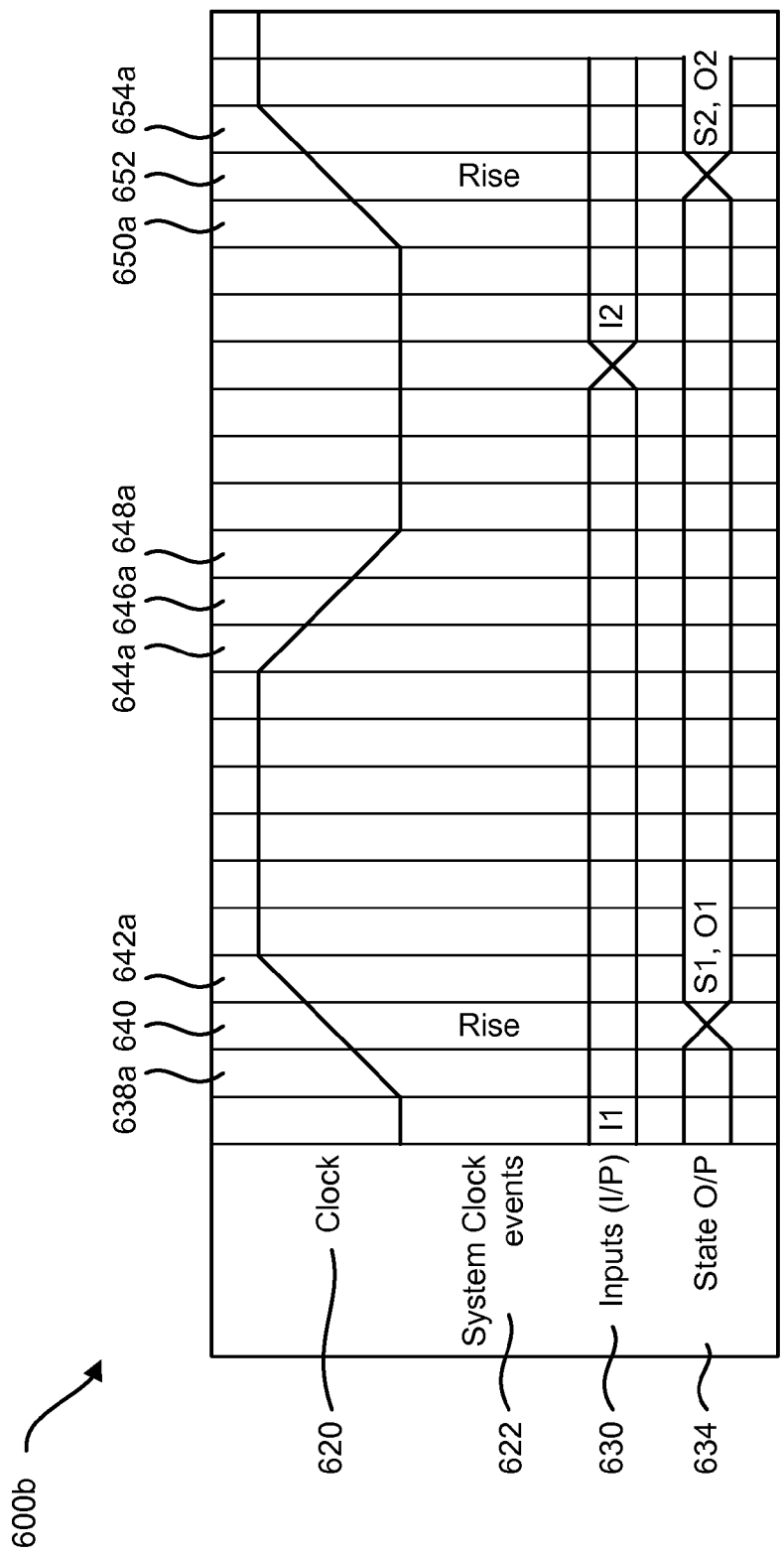
FIG. 8 illustrates the waveform of FIG. 6 with additional phases turned off.

FIG. 8 illustrates the waveform 600b of FIG. 6 with additional phases having been turned off. If cycle accuracy is not necessary, the pre-rise phase 638a may be turned off, and only the rise 640 phase may be used. In this example, the pre-rise 638a, post-rise 642a, pre-fall 644a, fall 646a, post-fall 648a, pre-rise 650a and post-rise 654a phases have all been turned off. If these phases are not needed, they can be turned off, which may speed up the simulation significantly.

For software development, clocks may not be necessary. Thus, all phases of the clock can be turned off. The components 103 just react to inputs 204 rather than sampling and processing on clock events/edges. The simulation speed then completely depends on the communication between the components 103.

Phase gating can be turned on or off dynamically during simulation based on whether or not timing accuracy is needed, to what extent it is needed, and whether a block 103 is active or idle. Thus, the simulation can always be tuned for the fastest possible simulation speed based on the requirements.

Figure 9:
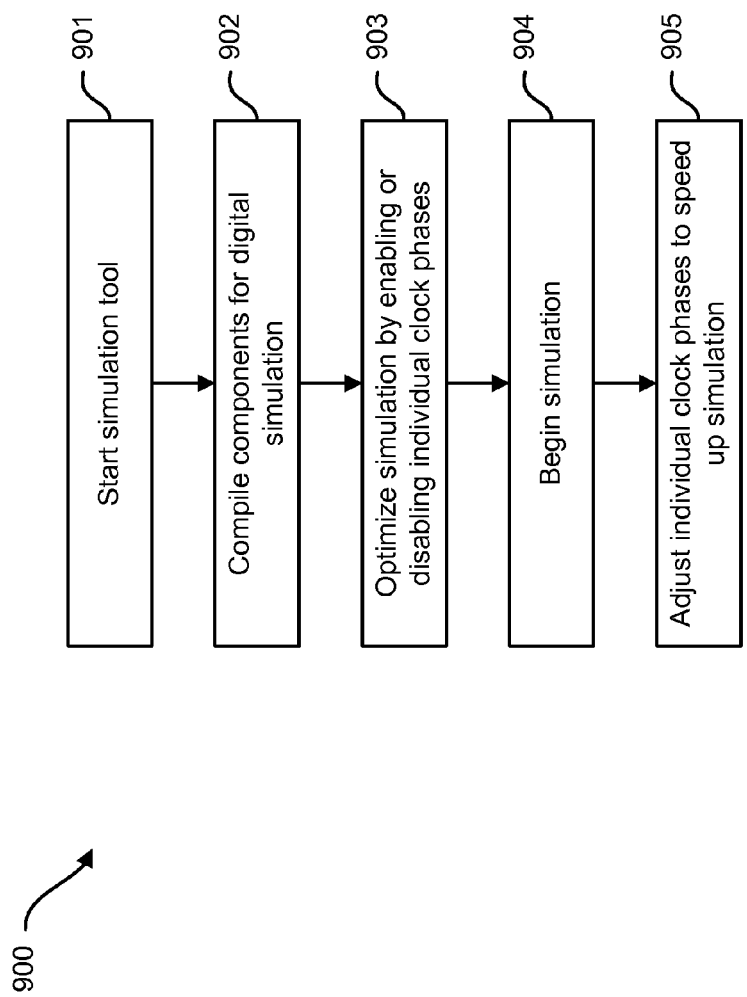
FIG. 9 is a flow diagram of a method for improving digital simulation speed by clock phase gating.

FIG. 9 is a flow diagram of a method 900 for improving digital simulation speed by clock phase gating. The simulation tool 102 begins 901 running on the computing device 101. The simulation tool 102 compiles or loads 902 the digital components 103 for use in a digital simulation. The simulation tool 102 then optimizes 903 simulation speeds by enabling or disabling individual clock phases 104. The simulation tool 102 may enable or disable individual clock phases 104 for the entire simulated digital system 200 or it may enable or disable individual clock phases 104 for individual blocks 103 of the digital system 200. The simulation tool 102 then begins 904 the simulation. If necessary, the simulation tool 102 may then adjust 905 the individual clock phases 104 dynamically (during the simulation) to speed up simulation.

The method 900 of FIG. 9 described above may be performed by various hardware and/or software component(s) and/or module(s) corresponding to the means-plus-function blocks 900A illustrated in FIG. 9A. In other words, blocks 901 through 905 illustrated in FIG. 9 correspond to means-plus-function blocks 901A through 905A illustrated in FIG. 9A.

Figure 10:
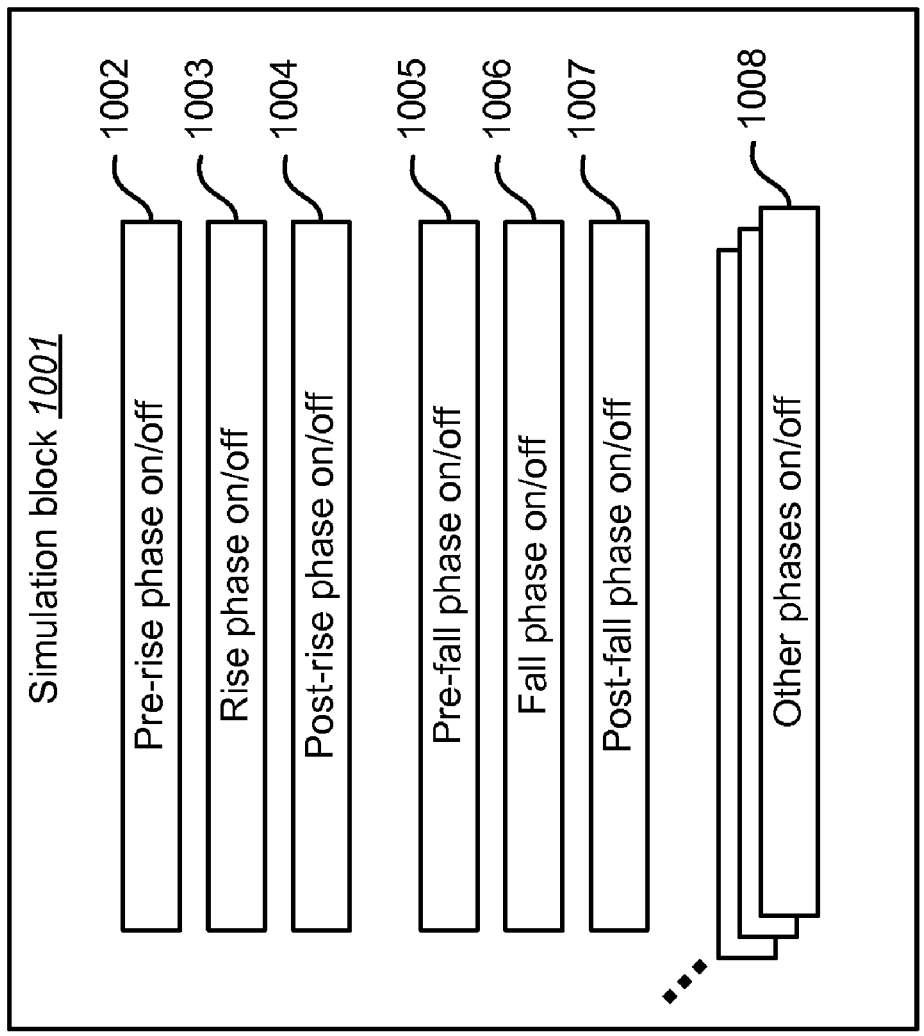
FIG. 10 is a block diagram illustrating a simulation block.

FIG. 10 is a block diagram illustrating a simulation block 1001 with clock phase gating. The simulation block 1001 may have individualized settings for each of the phases that it receives during simulation. In one configuration, the simulation block 1001 may have a setting that determines whether it will receive and process pre-rise phases 1002. In another configuration, the simulation block 1001 may have a setting that determines whether it will receive and process rise phases 1003. Likewise, the simulation block 1001 may have on/off settings for the post-rise phase 1004, pre-fall phase 1005, fall phase 1006, and post-fall phases 1007. Each of these settings may be configured to on or off. Alternatively, the phase settings may be adjusted dynamically by the simulation block 1001 during simulation to increase the simulation speed. Additional other phases 1008 may be configured for the simulation block 1001.

Figure 11:
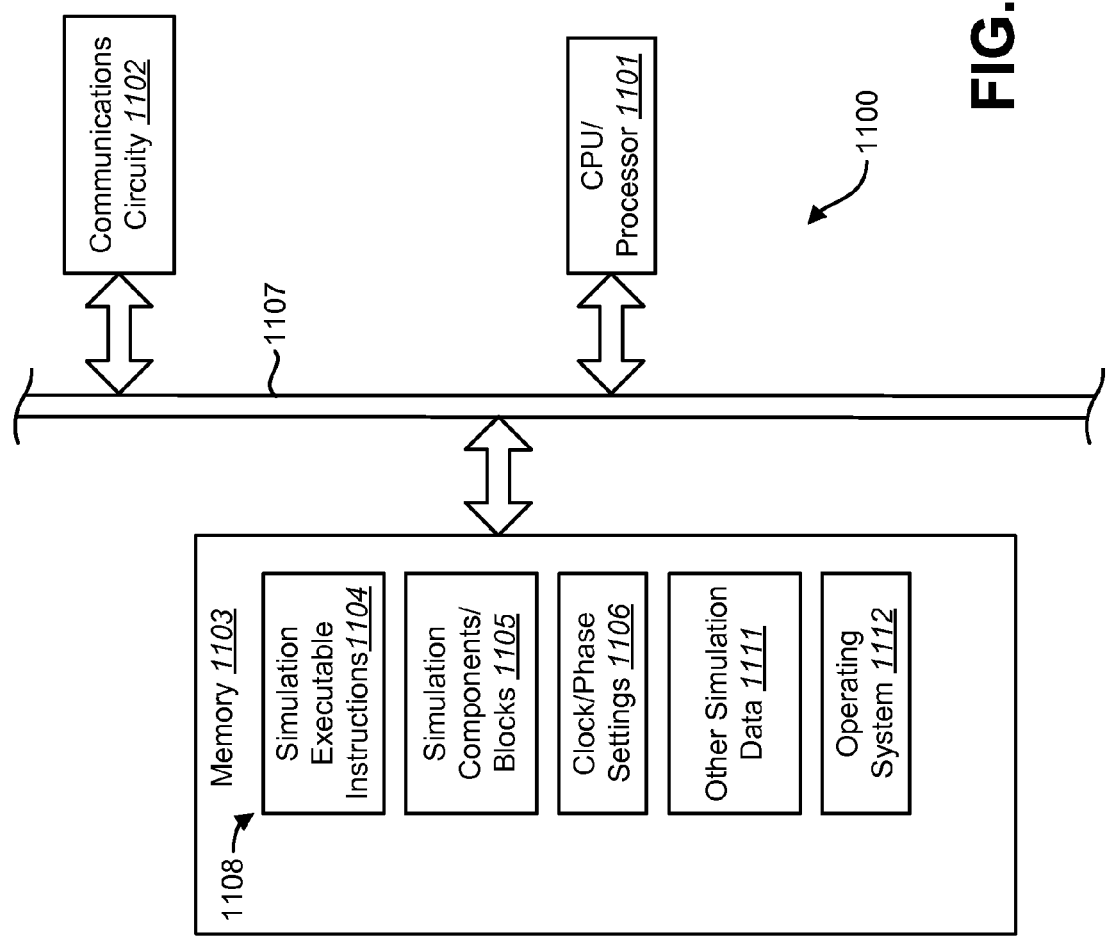
FIG. 11 illustrates part of the hardware that may be used to implement an apparatus for improving digital simulation speed by clock phase gating.

FIG. 11 illustrates part of the hardware that may be used to implement an apparatus for improving digital simulation speed by clock phase gating. The apparatus is signified by the reference numeral 1100 and can be implemented by various computing devices.

The apparatus 1100 includes a central data bus 1107 linking several circuits, electronic components or boards together. The circuits/boards/electronic components include a CPU (Central Processing Unit) or a processor 1101, a communications circuit 1102 (such as a network card), and memory 1103.

The communications circuit 1102 may be configured for receiving data from and sending data to other apparatuses (e.g., other hardware units) via wired or wireless connections. The CPU/processor 1101 performs the function of data management of the data bus 1107 and further the function of general data processing, including executing the instructional contents of the memory 1103.

The memory 1103 includes a set of modules, instructions and/or data generally signified by the reference numeral 1108. In this embodiment, the modules/instructions 1108 include, among other things, simulation executable instructions 1104 for creating and running digital system simulations. The simulation executable instructions 1104 include instructions to implement the simulation tool 102 or simulator and provides hooks to enable/disable clocks and phases as described herein. Simulation components/blocks 1105 are used by the simulation executable instructions 1104 to perform digital systems simulations and may include data for modeling hardware components. The models or blocks model the behavior of the hardware and controls clock phases to provide the ability to speed up simulation. Clock/phase settings 1106 are for controlling the various phases used during the digital system simulation. The simulation instructions 1104, simulation components/blocks 1105, and clock phase settings 1106 include computer instructions or code for executing the process steps as shown and described herein.

The memory 1103 may include the operating system 1112 for the apparatus 1100 (e.g., Windows®, Linux®, Unix®, etc.). In addition, other simulation data 1111 that may be used by the simulation tool 102 may also be stored in the memory 1103.

The memory 1103 may be any electronic component capable of storing electronic information. The memory 1103 may be embodied as random access memory (RAM), read only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof.

It should be further be noted that the inventive processes as described can also be coded as computer-readable instructions carried on any computer-readable medium known in the art. In this specification and the appended claims, the term "computer-readable medium" refers to any medium that may provide instructions to any processor, such as the CPU/processor 1101 shown and described in the drawing figure of FIG. 11, for execution. Such a medium can be of the storage type and may take the form of a volatile or non-volatile storage medium as also described previously, for example, in the description of the memory 1103 in FIG. 11. The computer-readable medium, described further below, can be part of a computer product separate from the apparatus 1103.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An apparatus for simulating digital systems, the apparatus comprising:
    a processor;
    memory in electronic communication with the processor;
    instructions stored in the memory, the instructions being executable by the processor to:
        start a simulation tool on the apparatus, wherein the simulation tool is capable of simulating a plurality of digital components;
        simulate a digital system using the simulation tool, wherein the digital system comprises the plurality of digital components; and
        dynamically disable one of the clock phases input to one of the digital components during simulation.

2. The apparatus of claim 1, wherein the instructions are further executable to dynamically adjust other clock phases during simulation of the digital system.

3. The apparatus of claim 1, wherein the plurality of digital components include clock phase settings to enable and disable clock phases.

4. The apparatus of claim 3, wherein the clock phase settings include a pre-rise phase setting, a rise phase setting, a post-rise phase setting, a pre-fall phase setting, a fall phase setting and a post-fall phase setting.

5. The apparatus of claim 1, wherein each digital component uses individually configured clock phases.

6. The apparatus of claim 1, wherein the plurality of digital components includes logic gates.

7. The apparatus of claim 1, wherein the plurality of digital components includes integrated circuits.

8. The apparatus of claim 1, wherein the clock phase is selected from the group consisting of a pre-rise phase, a rise phase, a post-rise phase, a pre-fall phase, a fall phase and a post-fall phase.

9. A method for simulating digital systems, the method comprising:
    starting a simulation tool, wherein the simulation tool is capable of simulating a plurality of digital components;
    simulating a digital system using the simulation tool, wherein the digital system comprises the plurality of digital components; and
    dynamically disabling one of the clock phases input to one of the digital components during simulation.

10. The method of claim 9, further comprising dynamically adjusting other clock phases during simulation of the digital system.

11. The method of claim 9, wherein the plurality of digital components include clock phase settings to enable and disable clock phases.

12. The method of claim 11, wherein the clock phase settings include a pre-rise phase setting, a rise phase setting, a post-rise phase setting, a pre-fall phase setting, a fall phase setting and a post-fall phase setting.

13. The method of claim 9, wherein each digital component uses individually configured clock phases.

14. The method of claim 9, wherein the plurality of digital components includes logic gates.

15. The method of claim 9, wherein the plurality of digital components includes integrated circuits.

16. The method of claim 9, wherein the clock phase is selected from the group consisting of a pre-rise phase, a rise phase, a post-rise phase, a pre-fall phase, a fall phase and a post-fall phase.

17. An apparatus for simulating digital systems, the apparatus comprising:
    means for starting a simulation tool on the apparatus, wherein the simulation tool is capable of simulating a plurality of digital components;
    means for simulating a digital system using the simulation tool, wherein the digital system comprises the plurality of digital components; and
    means for dynamically disabling one of the clock phases input to one of the digital components during simulation.

18. The apparatus of claim 17, further comprising means for dynamically adjusting other clock phases during simulation of the digital system.

19. The apparatus of claim 17, wherein the plurality of digital components include clock phase settings to enable and disable clock phases.

20. The apparatus of claim 19, wherein the clock phase settings include a pre-rise phase setting, a rise phase setting, a post-rise phase setting, a pre-fall phase setting, a fall phase setting and a post-fall phase setting.

21. The apparatus of claim 17, wherein each digital component uses individually configured clock phases.

22. The apparatus of claim 17, wherein the plurality of digital components includes logic gates.

23. The apparatus of claim 17, wherein the plurality of digital components includes integrated circuits.

24. A computer-program product for simulating digital systems, the computer-program product comprising a computer-readable medium having instructions thereon, the instructions comprising:
    code for starting a simulation tool, wherein the simulation tool is capable of simulating a plurality of digital components;
    code for simulating a digital system using the simulation tool, wherein the digital system comprises the plurality of digital components; and
    code for dynamically disabling one of the clock phases input to one of the digital components during simulation.

25. The computer-program product of claim 24, further comprising code for dynamically adjusting other clock phases during simulation of the digital system.

26. The computer-program product of claim 24, wherein the plurality of digital components include clock phase settings to enable and disable clock phases.

27. The computer-program product of claim 26, wherein the clock phase settings include a pre-rise phase setting, a rise phase setting, a post-rise phase setting, a pre-fall phase setting, a fall phase setting and a post-fall phase setting.

28. The computer-program product of claim 24, wherein each digital component uses individually configured clock phases.

29. The computer-program product of claim 24, wherein the plurality of digital components includes logic gates.

30. The computer-program product of claim 24, wherein the plurality of digital components includes integrated circuits.

* * * * *